US009048099B2

(12) United States Patent
Wang et al.

(10) Patent No.: US 9,048,099 B2
(45) Date of Patent: Jun. 2, 2015

(54) MULTI-LAYER AMORPHOUS SILICON STRUCTURE WITH IMPROVED POLY-SILICON QUALITY AFTER EXCIMER LASER ANNEAL

(71) Applicant: Applied Materials, Inc., Santa Clara, CA (US)

(72) Inventors: Qunhua Wang, Santa Clara, CA (US); Lai Zhao, Campbell, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 57 days.

(21) Appl. No.: 14/049,197

(22) Filed: Oct. 8, 2013

(65) Prior Publication Data

US 2014/0335680 A1 Nov. 13, 2014

Related U.S. Application Data

(60) Provisional application No. 61/821,564, filed on May 9, 2013.

(51) Int. Cl.
*H01L 21/02* (2006.01)

(52) U.S. Cl.
CPC ...... *H01L 21/0262* (2013.01); *H01L 21/02532* (2013.01); *H01L 21/02592* (2013.01); *H01L 21/02675* (2013.01); *H01L 21/02488* (2013.01)

(58) Field of Classification Search
CPC .............. H01L 21/02532; H01L 21/02592; H01L 21/02667–21/02691; H01L 21/2033
USPC ......................................................... 438/763
See application file for complete search history.

(56) References Cited

U.S. PATENT DOCUMENTS

| 6,169,013 | B1 | 1/2001 | Voutsas |
| 2002/0171122 | A1 * | 11/2002 | Voutsas .................. 257/588 |
| 2005/0003639 | A1 | 1/2005 | Chang |
| 2005/0202653 | A1 | 9/2005 | Joshi et al. |
| 2006/0030109 | A1 | 2/2006 | Ranade et al. |
| 2006/0183350 | A1 | 8/2006 | Kudo et al. |

* cited by examiner

*Primary Examiner* — Daniel Shook
(74) *Attorney, Agent, or Firm* — Patterson & Sheridan, LLP (57) ABSTRACT

The embodiments described herein generally relate to methods for forming a multi-layer amorphous silicon structure that may be used in thin film transistor devices. In one embodiment, a method includes positioning a substrate comprising a buffer layer in a process chamber, the process chamber comprising a processing region, forming a plurality of amorphous silicon layers and annealing the amorphous silicon layers to form a polycrystalline silicon layer. Forming the plurality of layers includes delivering a silicon-containing precursor and a first activation gas to the processing region to deposit a first amorphous silicon layer over the buffer layer, the silicon-containing precursor and the first activation gas being activated by a plasma and maintaining a continuous flow of the silicon-containing precursor while delivering a second activation gas, without the first activation gas, to the processing region to deposit a second silicon layer on the first silicon layer.

20 Claims, 6 Drawing Sheets

MULTI-LAYER AMORPHOUS SILICON STRUCTURE WITH IMPROVED POLY-SILICON QUALITY AFTER EXCIMER LASER ANNEAL

CROSS-REFERENCE TO RELATED APPLICATIONS

This application claims benefit of U.S. Provisional Patent Application Ser. No. 61/821,564, filed May 9, 2013, which is herein incorporated by reference.

BACKGROUND

1. Field

Embodiments disclosed herein generally relate to methods for forming a silicon-containing layer. More particularly, embodiments herein relate to methods for forming a silicon-containing layer that may be used in thin film transistor (TFT) devices.

2. Description of the Related Art

Low Temperature Poly Silicon (LTPS) is commonly used as the channel layer in the next generation TFT display and Active Matrix Organic Light Emitting Diode (AMOLED) due to benefits including high mobility (>50 cm2/Vs) and producibility under low temperature (<500° C.). LTPS is commonly produced using an amorphous silicon structure.

A common method to crystallize the amorphous silicon structure in industry is through excimer laser annealing (ELA). Both film properties of the amorphous silicon structure and process conditions of the ELA have effects in determining the process of the crystallization and therefore the film properties as well as the final device performance.

The ever-progressing display technology calls for a channel layer with larger driving current, better uniformity and less production cost. These demands require high quality polycrystalline silicon with higher mobility (above 90 $cm^2$/Vs) while keep using current equipment set of Plasma Enhanced Chemical Vapor Deposition (PECVD) and the ELA tool. Larger and more uniform crystalline grain size can benefit mobility. However, current techniques are limited to a grain size below 300~500 nm.

Thus, there is a continuing need for methods of forming highly crystalline silicon-containing materials.

SUMMARY

The embodiments described herein generally relate to formation of multi-layer amorphous silicon layers. The multi-layer amorphous silicon structure improves the crystallinity and the mobility of the polycrystalline silicon by modifying the film structure and therefore the crystallization process.

In one embodiment, a method can include depositing a first buffer layer comprising silicon nitride on a substrate; depositing a second buffer layer comprising silicon oxide on the first buffer layer; depositing a first amorphous silicon layer, the depositing comprising delivering a silicon-containing precursor and a first activation gas to a processing region to deposit the first amorphous silicon layer over a substrate, the silicon-containing precursor and the first activation gas being activated by a plasma; depositing a second amorphous silicon layer on the first amorphous silicon layer, the depositing comprising maintaining a continuous flow of the silicon-containing precursor while delivering a second activation gas to the processing region while stopping delivery of the first activation gas, the silicon-containing precursor and the second activation gas being activated by a plasma; and annealing the first and second amorphous silicon layers after the dehydrogenation to form a polycrystalline silicon layer.

In another embodiment, a method can include depositing a first buffer layer comprising silicon nitride on a substrate; depositing a second buffer layer comprising silicon oxide on the first buffer layer; depositing a first amorphous silicon layer over the second buffer layer, the depositing comprising delivering a silicon-containing precursor and a first activation gas to a processing region of a chamber in the presence of a plasma; depositing a second amorphous silicon layer over the first amorphous silicon layer, the depositing comprising maintaining a continuous flow of the silicon-containing precursor while delivering a second activation gas to the processing region in the presence of a plasma and while stopping delivery of the first activation gas; depositing a third amorphous silicon layer over the second amorphous silicon layer, the depositing comprising delivering a second deposition gas comprising the silicon-containing precursor and the first activation gas to the processing region in the presence of a plasma; and annealing the third amorphous silicon layer, the second amorphous silicon layer and the first amorphous silicon layer to form a polycrystalline silicon layer after the dehydrogenation.

In another embodiment, a method can include depositing a first buffer layer comprising silicon nitride on a substrate; depositing a second buffer layer comprising silicon oxide on the first buffer layer; depositing a first amorphous silicon layer over the second buffer layer, the depositing comprising delivering a first deposition gas comprising silane and hydrogen ($H_2$) to a processing region of a chamber in the presence of a plasma; depositing a second amorphous silicon layer over the first amorphous silicon layer, the depositing comprising delivering a second deposition gas comprising silane and an inert gas to the processing region in the presence of a plasma, wherein an interface is formed between the first amorphous silicon layer and the second amorphous silicon layer; and annealing the second amorphous silicon layer and the first amorphous silicon layer to form a polycrystalline silicon layer after the dehydrogenation.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein generally relate to methods for forming a silicon-containing layer that may be used in TFT devices. The embodiments disclosed herein are more clearly described with reference to the figures below.

The invention is illustratively described below utilized in a processing system, such as a PECVD system available from AKT America, a division of Applied Materials, Inc., located in Santa Clara, Calif. However, it should be understood that the invention has utility in other system configurations, including those sold by other manufacturers.

Figure 1:
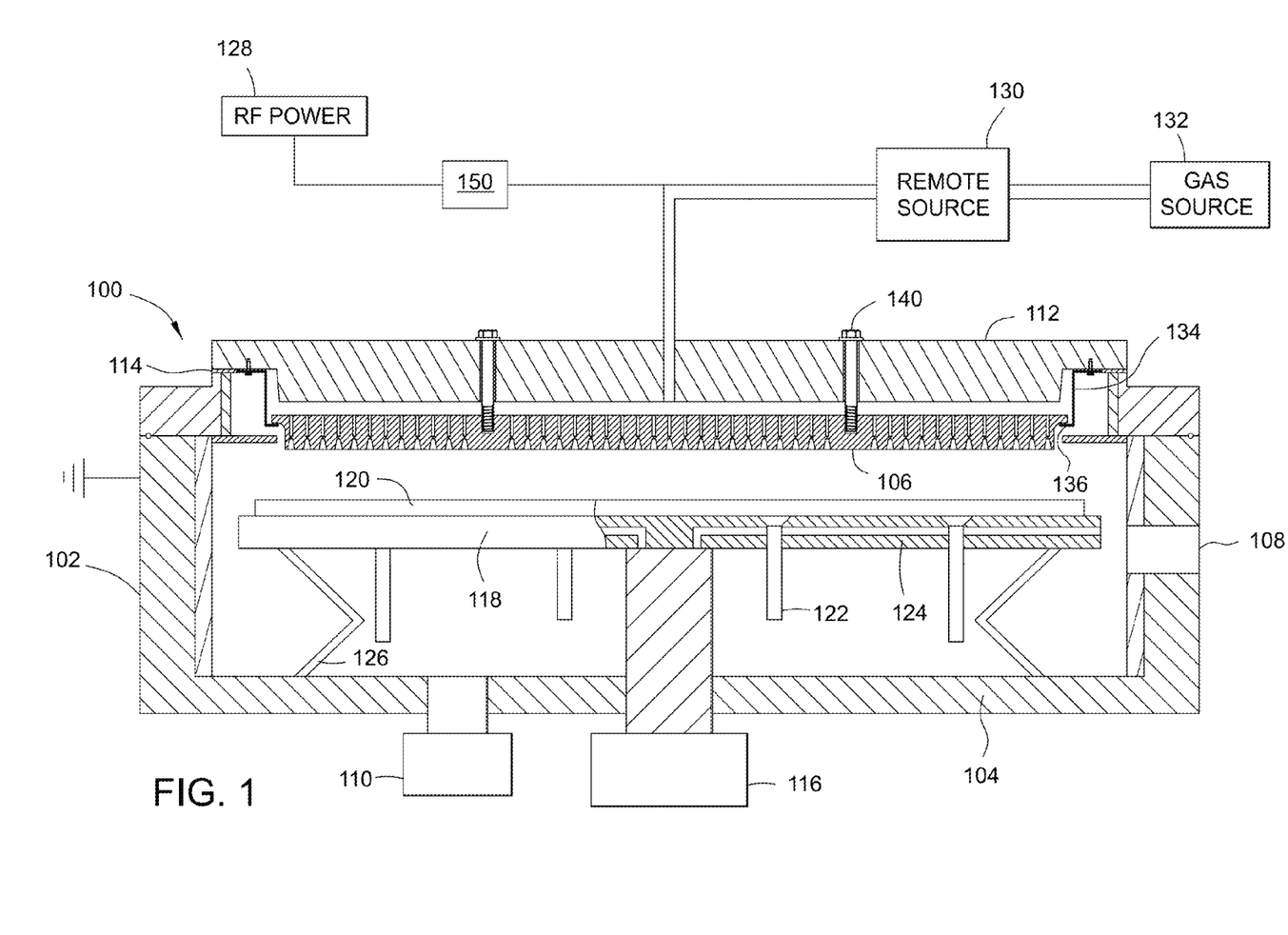
FIG. 1 is a schematic, cross sectional view of a process chamber that may be used to perform the operations described herein.

FIG. 1 is a schematic, cross sectional view of an apparatus that may be used to perform the operations described herein. The apparatus includes a chamber 100 in which one or more films may be deposited onto a substrate 120. The chamber 100 generally includes walls 102, a bottom 104 and a showerhead 106 which define a process volume. A substrate support 118 is disposed within the process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move a substrate to and from the substrate receiving surface. The substrate support 118 may also include heating and/or cooling elements 124 to maintain the substrate support 118 at a desired temperature. The substrate support 118 can also include RF return straps 126 to provide an RF return path at the periphery of the substrate support 118.

The showerhead 106 can be coupled to a backing plate 112 by a fastening mechanism 140. The showerhead 106 may be coupled to the backing plate 112 by one or more fastening mechanisms 140 to help prevent sag and/or control the straightness/curvature of the showerhead 106.

A gas source 132 can be coupled to the backing plate 112 to provide process gases through gas passages in the showerhead 106 to a processing area between the showerhead 106 and the substrate 120. The gas source 132 can include a silicon-containing gas supply source, an oxygen containing gas supply source, and a carbon-containing gas supply source, among others. Typical process gases useable with one or more embodiments include silane ($SiH_4$), disilane, $N_2O$, ammonia ($NH_3$), $H_2$, $N_2$ or combinations thereof.

A vacuum pump 110 is coupled to the chamber 100 to control the process volume at a desired pressure. An RF source 128 can be coupled through a match network 150 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by RF current from the RF source 128 that is provided to the showerhead 106.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 100.

Figure 2:
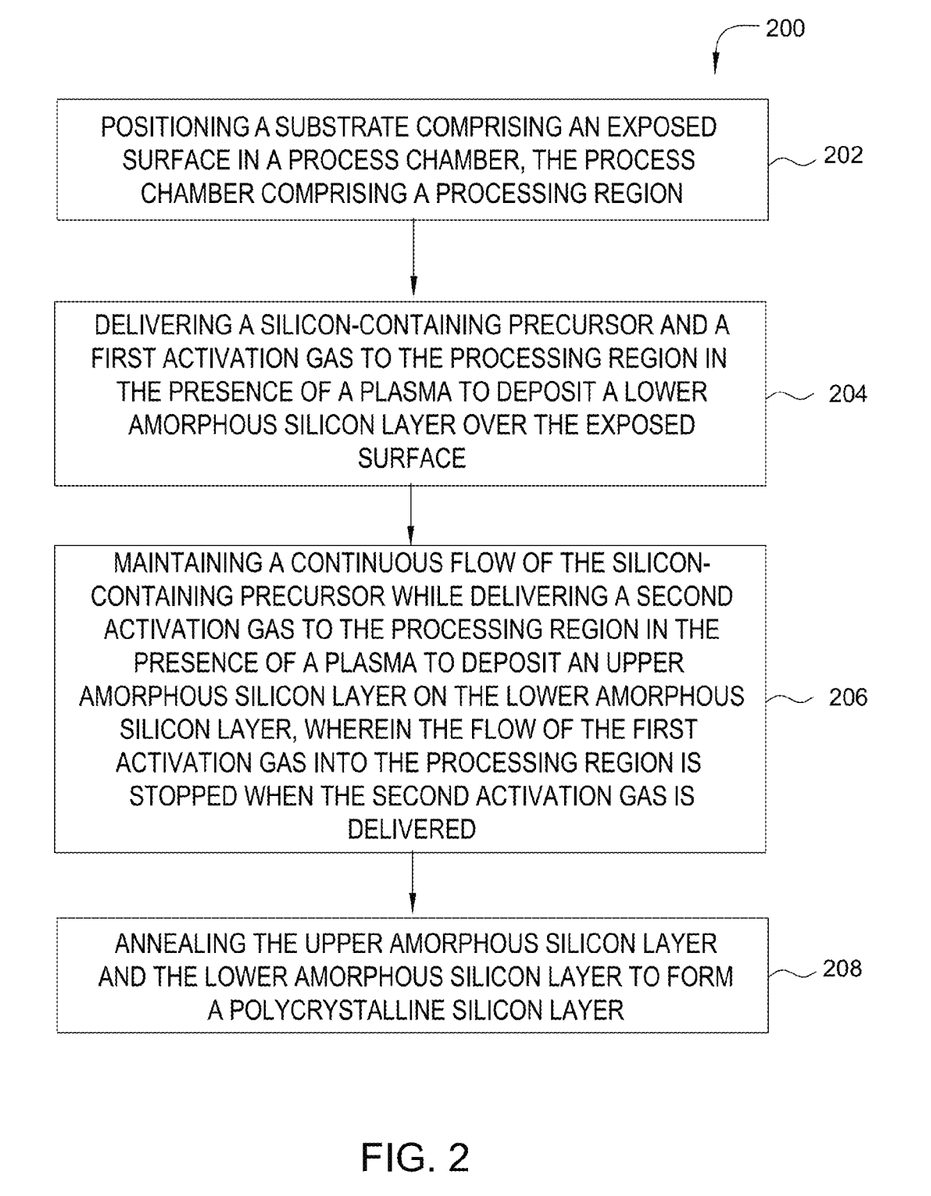
FIG. 2 depicts a flow diagram of one embodiment of a deposition process.

FIGS. 2 and 3 depict a method for depositing an amorphous silicon layer according to one embodiment. FIG. 2 depicts a flow diagram of one embodiment of a deposition method 200 that may be practiced in the chamber 100, as described in FIG. 1, or other suitable processing chamber. FIG. 3 depicts a device 300 comprising a substrate 302, a silicon nitride buffer layer 304 and a silicon oxide buffer layer 306. The substrate 302 is processed by the method 200, according to one embodiment. The method 200 illustrates a method of depositing a multi layer amorphous silicon layer that may be used in TFT devices, or diode devices. In one embodiment, the silicon containing layer as described is a multi-layer amorphous silicon layer which can then later be thermally processed to form a polycrystalline silicon layer.

Figure 3A:
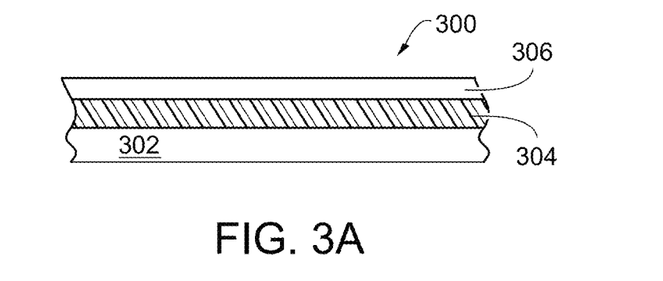
FIGS. 3A-3D depict a deposition process according to one embodiment.

The method 200 begins at step 202 by positioning the substrate 302, as shown in FIG. 3A, into a process chamber, such as the PECVD chamber 100 depicted in FIG. 1. The process chamber can further include a processing region. As described with reference to FIG. 3A, the substrate 302 may have one or more buffer layers disposed thereon, depicted here as the silicon nitride buffer layer 304 and the silicon oxide buffer layer 306. It is noted that the substrate 302 may have different combination of films, structures or layers previously formed thereon to facilitate forming different device structures on the substrate 302. In the embodiment wherein the silicon nitride buffer layer 304, the silicon oxide buffer layer 306 or both are not present, the amorphous silicon layer may be formed on the substrate 302 directly or the remaining buffer layer as available.

In one embodiment, the substrate 302 may be any one of glass substrate, plastic substrate, polymer substrate, metal substrate, singled substrate, roll-to-roll substrate, or other transparent substrate suitable for forming a thin film transistor thereon.

Figure 3B:
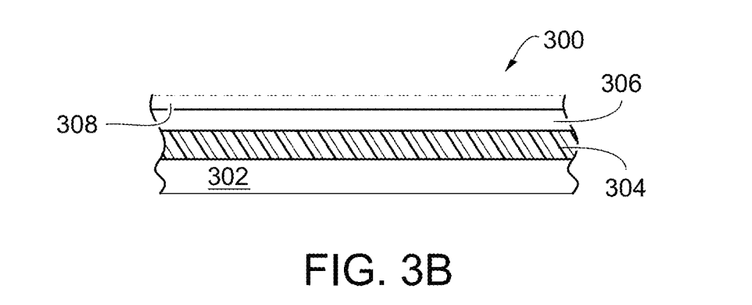

With the substrate 302 positioned in the process chamber, a silicon-containing precursor and a first activation gas are delivered to the processing region in the presence of a plasma to deposit a lower amorphous silicon layer 308 over the exposed surface, as in step 204. As depicted in FIG. 3B, a lower amorphous silicon layer 308 is deposited over the silicon oxide buffer layer 306. Suitable silicon-containing precursors include, but are not limited to, silane ($SiH_4$), disilane ($Si_2H_6$), silicon tetrafluoride ($SiF_4$), tetraorthosiloxane (TEOS), silicon tetrachloride ($SiCl_4$), dichlorosilane ($SiH_2Cl_2$), and combinations thereof. The first activation gas can either be an inert gas or a hydrogen-based gas. Suitable examples of the inert gas include He, Ar, Ne, Kr or combinations thereof. Suitable examples of the hydrogen-based gas include hydrogen gas ($H_2$). In one embodiment, the silicon-containing precursor described herein is silane ($SiH_4$) gas and the first activation gas is Ar.

In embodiments where the first activation gas is an inert gas, the gas mixture may include a silicon-containing precursor, an inert gas and substantially no hydrogen gas ($H_2$). The term "substantially no hydrogen gas" is intended to mean that a direct source of hydrogen gas is not utilized to form the gas mixture. Trace amount of hydrogen gas within the source of the inert gas and/or silicon-containing precursor may be present. In this embodiment, the first activation gas is an inert gas wherein the lower amorphous silicon layer is deposited with substantially no hydrogen.

The silicon-containing precursor and the inert gas are supplied at a predetermined gas flow ratio. The predetermined gas flow ratio of inert gas to silicon-containing precursor assists deposition of the amorphous silicon layer with a minimum number of hydrogen atoms included in the film. In one embodiment, the silicon-containing precursor and the inert gas are supplied into the processing chamber at a predetermined ratio, such as greater than 1:20. In one embodiment, the ratio (R) of the inert gas (such as argon gas) to the silicon-containing precursor (such as silane) is controlled about greater than 20 ($Ar/SiH_4$), for example greater than 50, such as between about 60 and about 200, and in another example, about between about 70 and 100, such as about 75. Alternatively, the silicon-containing precursor and inert gas supplied into the processing chamber may be supplied by volumetric flow rate per substrate surface area (or substrate support surface, as an approximate equivalence). In one embodiment, the $SiH_4$ gas may be supplied at between about 0.042 $sccm/cm^2$ and about 0.31 $sccm/cm^2$ into the processing chamber while inert gas may be supplied at a flow rate at between about 0.55 $sccm/cm^2$ and about 3.29 $sccm/cm^2$ into the processing chamber. Thus, the ratio of volumetric flow rate per substrate surface area for insert gas to silicon-containing precursor is between about 1.8:1 to about 79:1. In other words, the gas mixture has a volumetric flow rate per surface area of substrate for the inert gas that is between about 1.8 times to about 79 times a volumetric flow rate per surface area of substrate for the silicon-containing precursor. In one embodiment, the silicon-containing precursor is silane and the inert gas is argon.

It is believed that the inert gas (for example argon) supplied in the gas mixture has a relatively higher molecular weight as compared to silicon and hydrogen atoms supplied in the silicon-containing precursor (for example silane gas). When supplying the gas mixture during processing, the inert gas atoms in the gas mixture may assist driving out the weak and dangling bonds of the silicon-hydrogen and/or weak silicon-silicon bonding in the silicon layer, thereby allowing the silicon atoms in the silicon layer to form strong silicon to silicon bonds.

Several process parameters may be controlled during the deposition process. A RF source power may be applied to maintain the plasma during deposition. In one embodiment, the RF source power density may be supplied between about 10 $mWatt/cm^2$ and about 200 $mWatt/cm^2$. Alternatively, a VHF power may be utilized to provide a frequency up to between about 27 MHz and about 200 MHz. The process pressure is maintained at between about 0.1 Torr and about 10 Torr, such as between about 0.5 Torr and about 5 Torr, such as about 0.8 Torr and about 2 Torr. The spacing of the substrate to the gas distribution plate assembly may be controlled in accordance with the substrate dimension. In one embodiment, the processing spacing for a substrate greater than 1 square meter is controlled between about 400 mils and about 1200 mils, for example, between about 400 mils and about 850 mils, such as 580 mils. The substrate temperature may be maintained from about 150 degrees Celsius to about 500 degrees Celsius, such as at about 370 degrees Celsius.

In one embodiment, a relatively lower RF power, such as lower than 1500 Watts or less than 100 $mWatt/cm^2$, may be utilized. It is believed that lower RF power utilized during deposition can assist in forming the lower amorphous silicon layer 306 with good uniformity control. It is further believed that relatively lower RF power as utilized can reduce the sputtering effect that may be produced by the inert gas, thereby assisting in depositing the lower amorphous silicon layer 306 in a relatively gentle plasma environment, thereby forming the lower amorphous silicon layer 306 with good uniformity and surface roughness control.

Figure 3C:
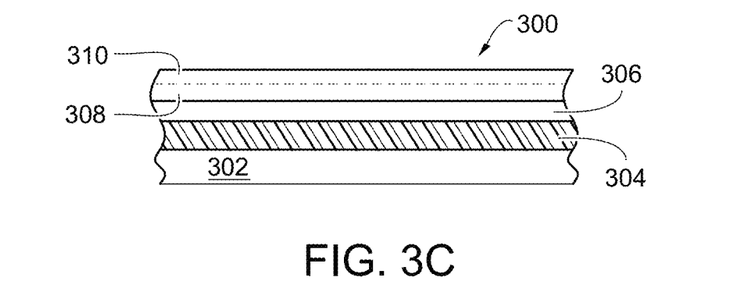

After sufficient growth of the lower amorphous silicon layer 308, an upper amorphous silicon layer 310 can be deposited by maintaining a continuous flow of the silicon-containing precursor while delivering a second activation gas to the processing region in the presence of a plasma, as in step 206. Depicted in FIG. 3C, is the substrate 302 with the silicon nitride buffer layer 304, the silicon oxide buffer layer 306, the lower amorphous silicon layer 308 and an upper amorphous silicon layer 310. In this embodiment, the flow of the first activation gas is stopped when the second activation gas is delivered. In this embodiment, the second activation gas is a hydrogen-based gas, as the first activation gas is an inert gas.

The dotted line depicted between the lower amorphous silicon layer 308 and the upper amorphous silicon layer 310 indicates that, due to the continuous flow of the silicon-containing precursor and the constant presence of an activation gas during the transition, the boundary between the two layers is not distinctly defined in this embodiment. As such, there is expected to be a region of the lower amorphous silicon layer 308 which is deposited only using the silicon-containing precursor and the inert gas (the region closest to the substrate), a region of the upper amorphous silicon layer 310 which is deposited only using the silicon-containing precursor and the hydrogen-based gas (the region closest to the exposed surface) and a region (described here as the transition region) between the two layers which was deposited using both activation gases and the silicon precursor.

Without intending to be bound by theory, it is believed to be beneficial to alternate between the inert gas and the hydrogen-based gas in depositing the amorphous silicon layers. The inert gas is believed to trigger more ionization while promoting ion bombardment, as opposed to $H_2$, which is believed to produce more radicals and H atomic etching during the deposition process. The differences between the inert gas deposition and the hydrogen-based gas deposition are believed to make the precursor film properties evolve in different ways after the crystallization process, such as from ELA. Thus, the differences in amorphous silicon film properties are believed to have an impact on crystallization and thus the quality of the polycrystalline silicon film which results.

The silicon-containing precursor and the hydrogen-based gas are supplied at a predetermined gas flow rate based on the surface area of the substrate. The silicon-containing precursor and hydrogen-based gas supplied into the processing chamber may be supplied by volumetric flow rate per substrate surface area (or substrate support surface, as an approximate equivalence). In one embodiment, the silicon-containing precursor is supplied into the processing chamber at volumetric flow rate of from about 0.042 $sccm/cm^2$ and about 0.31 $sccm/cm^2$. In one embodiment, the hydrogen-based gas is supplied into the processing chamber at from about 0.55 $sccm/cm^2$ and about 3.29 $sccm/cm^2$.

Once deposited, the upper amorphous silicon layer 310 and the lower amorphous silicon layer 308 can be annealed to form a polycrystalline silicon layer 312, as in step 208. Depicted in FIG. 3D, the polycrystalline silicon layer 312 is a combination of the upper amorphous silicon layer 310 and the lower amorphous silicon layer 308. The annealing process can be performed using a laser annealing process. The laser annealing process assists crystallizing the upper amorphous silicon layer 310 and the lower amorphous silicon layer 308 into the polycrystalline silicon layer 312. The thermal energy provided during the laser annealing process assists growing the grains from the upper amorphous silicon layer 310 and the lower amorphous silicon layer 308 into large size crystallized grains. In one embodiment, the laser annealing process utilized to crystallize the upper amorphous silicon layer 310 and the lower amorphous silicon layer 308 is an ELA process. The laser annealing process can thermally process the substrate to a temperature between about 100 degrees Celsius and about 1500 degrees Celsius.

Figure 3D:
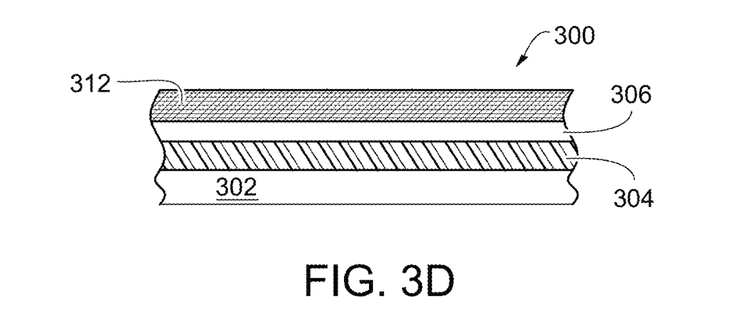

After the formation of the polycrystalline silicon layer 312, a patterning process or other deposition process may be performed to form the source and drain areas. The dual layer or multi layer amorphous silicon structures described herein are generally maintained at a thickness of between 30 nm and 100 nm, such as from 40 nm to 55 nm. Thus, the polycrystalline silicon quality is improved without increasing thickness of the polycrystalline silicon layer 312 over layers previously used.

Figure 4:
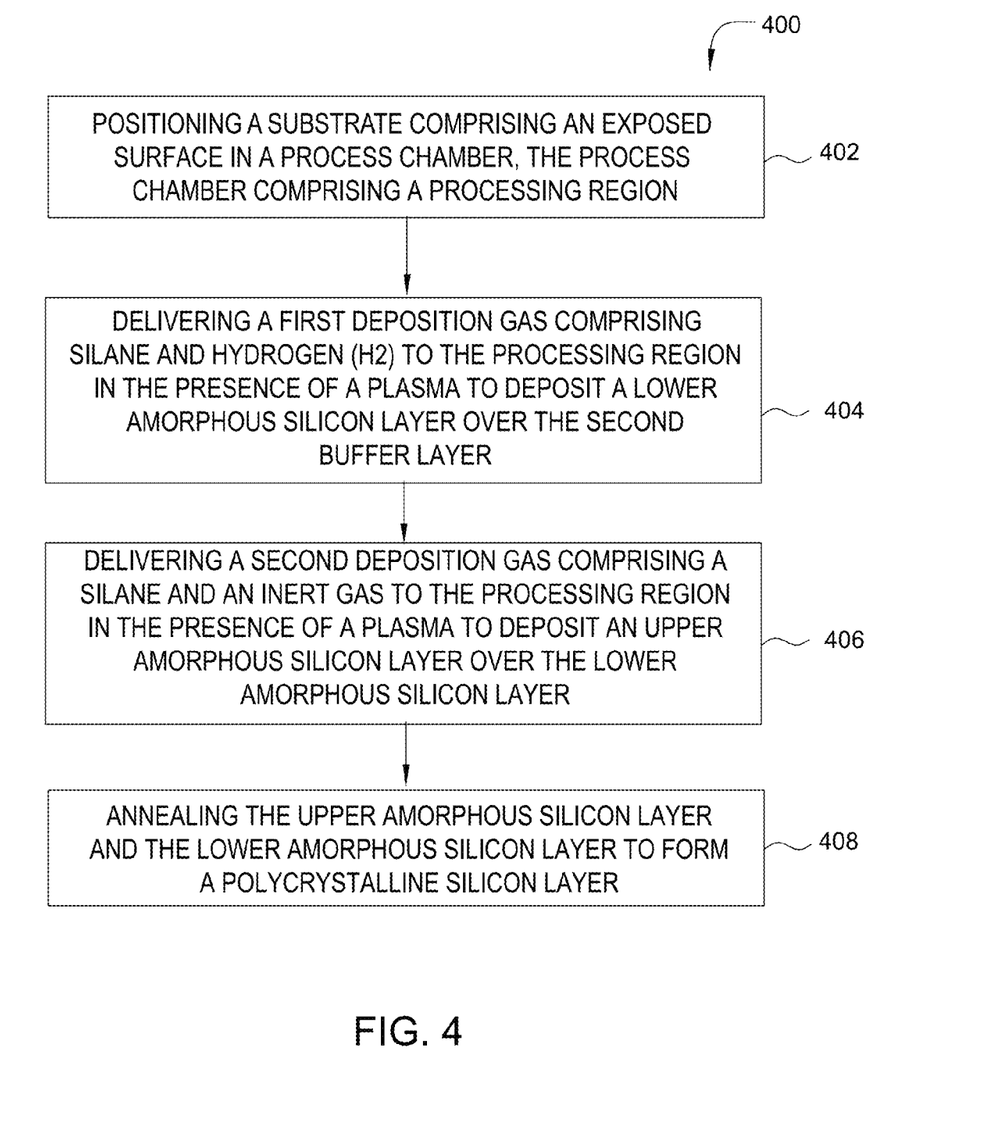
FIG. 4 depicts a flow diagram of another embodiment of a deposition process.

FIGS. 4 and 5 depict a method for depositing an amorphous silicon layer according to another embodiment. FIG. 4 depicts a flow diagram of one embodiment of a deposition process 400 that may be practiced in the chamber 100, as described in FIG. 1, or other suitable processing chamber. FIG. 5 depicts a device 500 comprising a substrate 502, a silicon nitride buffer layer 504 and a silicon oxide buffer layer 506. The process 400 illustrates a method of depositing a multi layer amorphous silicon layer that may be used in TFT devices, or diode devices. In one embodiment, the silicon containing layer as described is a multi-layer amorphous silicon layer which can then later be thermally processed to form a polycrystalline silicon layer.

Figure 5A:
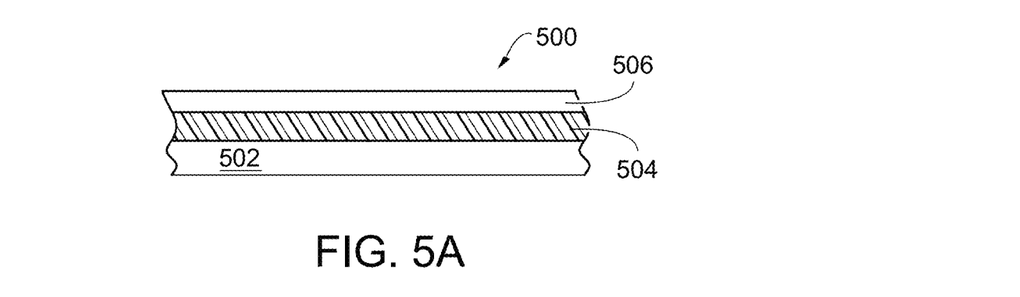
FIGS. 5A-5D depict a deposition process according to another embodiment.
Figure 5B:
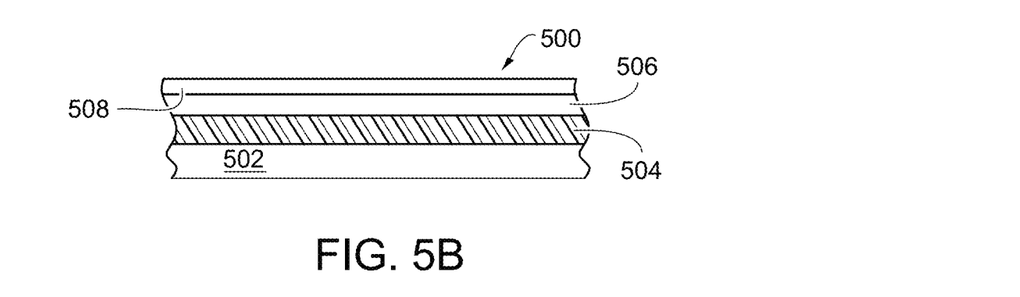

The process 400 begins at step 402 by positioning the substrate 502, as shown in FIG. 5A, into a process chamber, such as the PECVD chamber 100 depicted in FIG. 1. The process chamber can further include a processing region. The substrate 502 depicted here can be substantially similar to the substrate depicted in FIG. 3A and described with reference to FIG. 2. The substrate 502 can include one or more buffer layers, shown here as the silicon nitride buffer layer 304 and the silicon oxide buffer layer 306.

With the substrate 502 positioned in the process chamber, a first deposition gas comprising a silicon-containing precursor (such as silane) and a first activation gas (such as hydrogen) are delivered to the processing region in the presence of a plasma to deposit a lower amorphous silicon layer 508 over the exposed surface, as in step 404. The lower amorphous silicon layer 508 can be substantially similar to the lower amorphous silicon layer 308 described with reference to FIG. 2. In this embodiment, the deposition process described above is completely halted such that a clearly defined upper boundary of the lower amorphous silicon layer 508 is formed (as shown by the solid line depicted in FIG. 5B above the lower amorphous silicon layer 508). As will be noted, the activation gases as used in FIG. 2 are transposed such that the lower amorphous silicon layer 508 is deposited using the hydrogen-based gas and the upper amorphous silicon layer 510 is deposited using the inert gas.

Figure 5C:
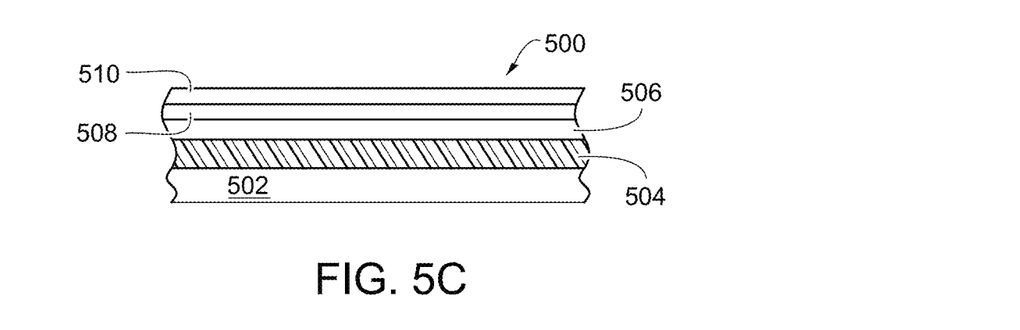

Once the lower amorphous silicon layer 508 is deposited, a second deposition gas comprising a silicon-containing precursor (such as silane) and a second activation gas (such as an inert gas) are delivered to the processing region in the presence of a plasma to deposit an upper amorphous silicon layer 510 over the lower amorphous silicon layer 508, as in step 406. The upper amorphous silicon layer 510 can be substantially similar to the upper amorphous silicon layer 310 disclosed with reference to FIG. 2. The defined boundaries may provide further advantage to the crystalline structure of the polycrystalline silicon layer after annealing.

Figure 5D:
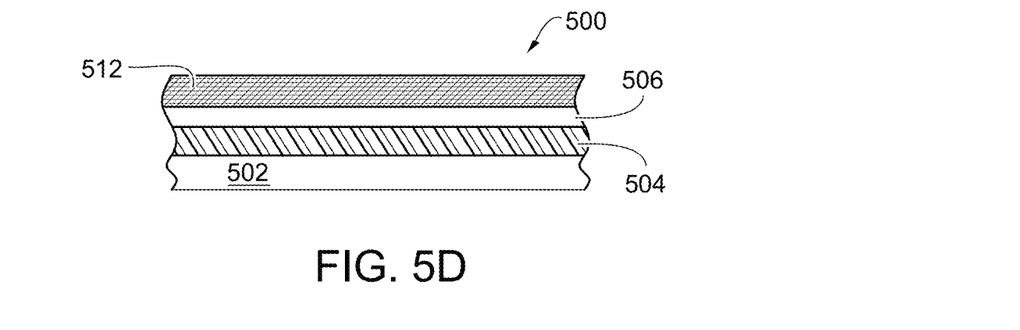

Once deposited, the upper amorphous silicon layer 510 and the lower amorphous silicon layer 508 can be annealed to form a polycrystalline silicon layer 512, as in step 408. Though the amorphous silicon layers depicted in the embodiments above comprise only two layers (the upper amorphous silicon layer 510 and the lower amorphous silicon layer 508), it is understood that more than two layers may be used to form the multi-layer amorphous silicon structure. For example, three or more amorphous silicon layers may be deposited over one or more buffer layers. The amorphous silicon layers can then be annealed using ELA to form the polycrystalline layer 512. The overall thickness of the multi-layer amorphous silicon structure can be between 30 nm and 100 nm, such as from 40 nm to 55 nm.

Figure 6:
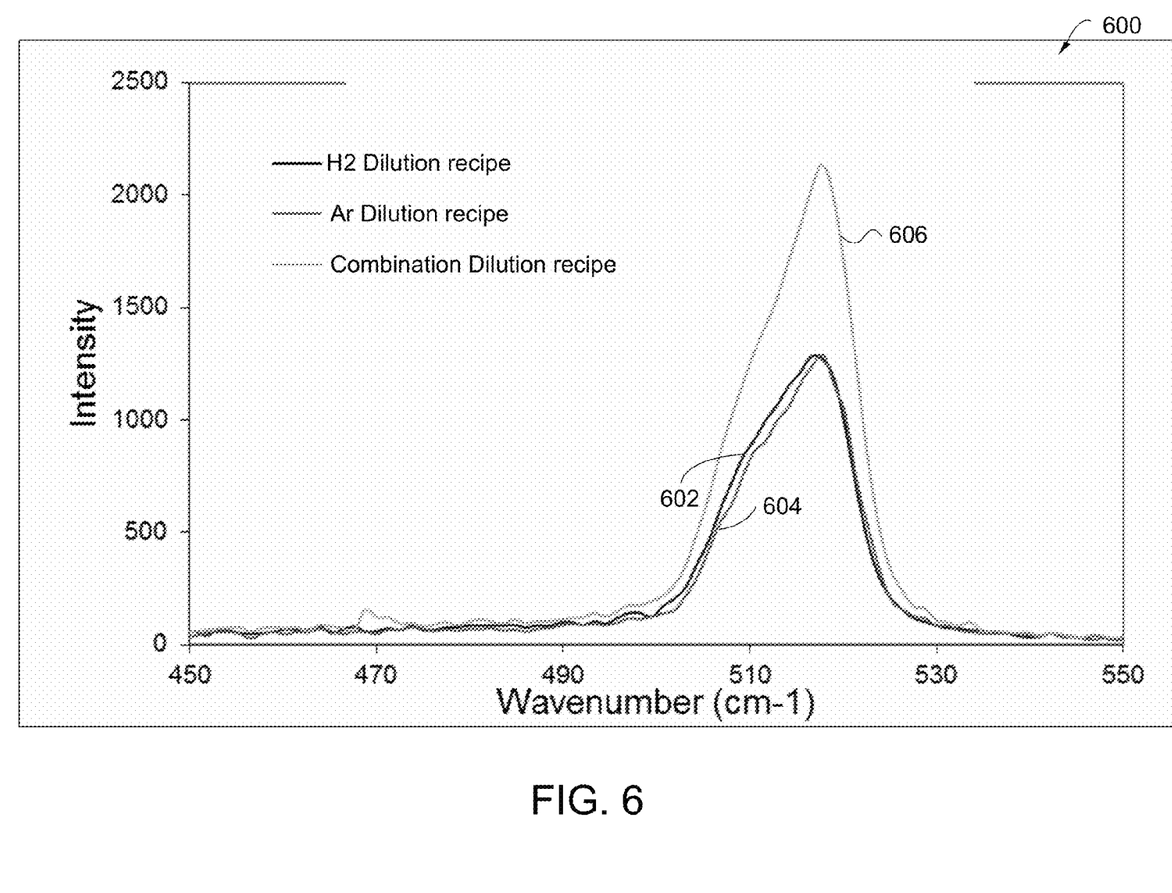
FIG. 6 depicts a graph of a spectroscopic analysis of crystallinity for polycrystalline silicon layers deposited by methods disclosed herein.

FIG. 6 depicts a graph 600 of a spectroscopic analysis of crystallinity for polycrystalline silicon layers deposited by methods disclosed herein. A first line 602 depicts the spectroscopic analysis of a polycrystalline silicon layer deposited using a silane—hydrogen deposition gas alone, a second line 604 depicts the spectroscopic analysis of a polycrystalline silicon layer deposited using a silane—argon deposition gas alone, and a third line 606 depicts a combination of the two deposition techniques, as described in the embodiments above. The polycrystalline silicon layers were deposited to 55 nm and annealed using an ELA and applying the same parameters described above.

The Raman spectroscopic spectra measures the peak for the crystalline fraction at wavenumber 520 $cm^{-1}$. This peak is understood to be increased directly proportional to the crystallinity of the silicon layer. Thus, this peak is used as an effective indicator of the crystallinity in the film of amorphous Si and polycrystalline Si. The higher the intensity of this peak, the more crystalline fraction in the unit volume of the film.

Experimental spectra show 60% higher crystalline peak on the polycrystalline silicon sample crystallized with multi-layer structure than those ones crystallized with single-layer structure. The single layer structures, either the conventional $H_2$ dilution recipe or the Ar dilution, show only minor differences from one another in this analysis. Thus, by this analysis, the crystallinity of the multi-layer structure is believed to be higher after annealing than either of the single layer structures alone.

The crystallinity described above also extends to increased mobility, as is expected. The mobility is one of the most important properties of the polycrystalline Si. For standard applications, such as TFT devices, the higher the mobility of the polycrystalline Si, the better the device performance. As measured from the examples described above, the polycrystalline silicon layer deposited using a silane—hydrogen deposition gas alone has a mobility of 72 $cm^2/Vs$, the polycrystalline silicon layer deposited using a silane—argon deposition gas alone has a mobility of 80 $cm^2/Vs$, the multi-layer deposition using a combination both activation gases has a mobility of 100 $cm^2/Vs$. Thus, the mobility measured on the sample crystallized with the multi-layer structure is 25% higher than the one crystallized with Ar-based amorphous silicon single layer film.

The methods disclosed above can further include a dehydrogenation step prior to crystallization of the amorphous silicon layers. In one or more embodiments, the amorphous silicon layers are sequentially deposited and then heated up to about 450 degrees Celsius or greater to perform a dehydrogenation process to remove hydrogen. An excess amount of hydrogen elements (e.g., an overly high concentration of hydrogen) in the amorphous silicon layer may penetrate into the adjacent gate dielectric layer or other adjacent layers, prior to forming the polysilicon channel layer, thereby resulting in current leakage or other types of device failure. By performing the dehydrogenation process, the hydrogen effects on adjacent layers can be avoided.

Embodiments disclosed herein relate to increased mobility in multi-layer polycrystalline silicon films. By alternating the formation of the silicon layer using the inert gas/silicon-containing gas combination and the hydrogen-based gas/silicon-containing gas combination, the crystallinity of the polycrystalline silicon post anneal and the mobility of the final Si layer is increased over a single layer polycrystalline silicon film.

While the foregoing is directed to embodiments of the invention, other and further embodiments of the invention may be devised without departing from the basic scope thereof.

The invention claimed is:

1. A method comprising:
depositing a first amorphous silicon layer, the depositing comprising delivering a silicon-containing precursor and a first activation gas to a processing region to deposit the first amorphous silicon layer over a substrate, the silicon-containing precursor and the first activation gas being activated by a plasma; and
depositing a second amorphous silicon layer on the first amorphous silicon layer, the depositing comprising maintaining a continuous flow of the silicon-containing precursor while delivering a second activation gas to the processing region while stopping delivery of the first activation gas, the silicon-containing precursor and the second activation gas being activated by a plasma;
dehydrogenating the first and second amorphous silicon layers; and
annealing the first and second amorphous silicon layers to form a polycrystalline silicon layer after the dehydrogenation.

2. The method of claim 1, wherein the silicon-containing precursor is silane.

3. The method of claim 1, wherein either the first activation gas or the second activation gas is an inert gas.

4. The method of claim 3, wherein the inert gas is argon.

5. The method of claim 1, wherein either the first activation gas or the second activation gas is hydrogen gas ($H_2$).

6. The method of claim 1, wherein the annealing is performed using excimer laser annealing.

7. The method of claim 1, further comprising depositing a third amorphous silicon layer over the second amorphous silicon layer using the silicon-containing precursor and the first activation gas.

8. The method of claim 1, wherein the first activation gas is argon, the second activation gas is hydrogen gas ($H_2$).

9. A method comprising:
depositing a first buffer layer comprising silicon nitride on a substrate;
depositing a second buffer layer comprising silicon oxide on the first buffer layer;
depositing a first amorphous silicon layer over the second buffer layer, the depositing comprising delivering a silicon-containing precursor and a first activation gas to a processing region of a chamber in the presence of a plasma;
depositing a second amorphous silicon layer over the first amorphous silicon layer, the depositing comprising maintaining a continuous flow of the silicon-containing precursor while delivering a second activation gas to the processing region in the presence of a plasma and while stopping delivery of the first activation gas;
depositing a third amorphous silicon layer over the second amorphous silicon layer, the depositing comprising delivering a second deposition gas comprising the silicon-containing precursor and the first activation gas to the processing region in the presence of a plasma;
dehydrogenating the third amorphous silicon layer, the second amorphous silicon layer and the first amorphous silicon layer; and
annealing the third amorphous silicon layer, the second amorphous silicon layer and the first amorphous silicon layer to form a polycrystalline silicon layer after the dehydrogenation.

10. The method of claim 9, wherein the silicon-containing precursor is silane or disilane.

11. The method of claim 9, wherein either the first activation gas or the second activation gas is argon.

12. The method of claim 9, wherein either the first activation gas or the second activation gas is hydrogen gas ($H_2$).

13. The method of claim 9, wherein the first activation gas is argon, the second activation gas is hydrogen gas ($H_2$) and the third activation gas is argon.

14. The method of claim 9, wherein the annealing is performed using excimer laser annealing.

15. The method of claim 9, wherein the thickness of the second amorphous silicon layer and the first amorphous silicon layer combined is less than 55 nm.

16. A method comprising:
depositing a first buffer layer comprising silicon nitride on a substrate;
depositing a second buffer layer comprising silicon oxide on the first buffer layer;
depositing a first amorphous silicon layer over the second buffer layer, the depositing comprising delivering a first deposition gas comprising silane and hydrogen ($H_2$) to a processing region of a chamber in the presence of a plasma;
depositing a second amorphous silicon layer over the first amorphous silicon layer, the depositing comprising delivering a second deposition gas comprising silane and an inert gas to the processing region in the presence of a plasma, wherein an interface is formed between the first amorphous silicon layer and the second amorphous silicon layer;
dehydrogenating the first amorphous silicon layer and the second amorphous silicon layer; and
annealing the second amorphous silicon layer and the first amorphous silicon layer to form a polycrystalline silicon layer after the dehydrogenation.

17. The method of claim 16, wherein the inert gas is argon.

18. The method of claim 16, wherein the annealing is performed using excimer laser annealing.

19. The method of claim 16, wherein the thickness of the second amorphous silicon layer and the first amorphous silicon layer combined is less than 55 nm.

20. The method of claim 16, wherein the thickness of the second amorphous silicon layer and the first amorphous silicon layer combined are substantially equal.

* * * * *